(12) United States Patent
Fujita et al.

(10) Patent No.: US 8,498,145 B2
(45) Date of Patent: Jul. 30, 2013

(54) SEMICONDUCTOR STORAGE DEVICE

(75) Inventors: Katsuyuki Fujita, Tokyo (JP);
Yoshihiro Ueda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 13/205,094

(22) Filed: Aug. 8, 2011

(65) Prior Publication Data
US 2012/0063216 A1 Mar. 15, 2012

(30) Foreign Application Priority Data

Sep. 14, 2010 (JP) ................................. 2010-205745

(51) Int. Cl.
*G11C 11/00* (2006.01)
(52) U.S. Cl.
USPC .......................................... 365/158; 365/148
(58) Field of Classification Search
USPC ................................. 365/148, 158
See application file for complete search history.

(56) References Cited

U.S. PATENT DOCUMENTS 7,457,150 B2 * 11/2008 Tsuchida et al. ............... 365/158
7,505,307 B2 * 3/2009 Ueda ............................. 365/158

FOREIGN PATENT DOCUMENTS

JP 2007-317795 A 12/2007

OTHER PUBLICATIONS

U.S. Appl. No. 12/847,892, Fujita et al.

* cited by examiner

*Primary Examiner* — Anthan Tran
(74) *Attorney, Agent, or Firm* — Knobbe, Martens, Olson & Bear, LLP

(57) ABSTRACT

A memory includes bit lines, word lines, and memory cells connected between first and second BLs. The cells arranged in an extending direction of the BLs constitute columns. The second BL is shared between two columns. The cells in a first pair of columns are arranged to be shifted in the extending direction of the BLs by a half-pitch from the cells in a second pair of columns. The device includes a dummy cell having an equal distance from the adjacent memory elements. Further, the device includes a row decoder driving the cells in the first pair of columns by driving paired word lines, and driving the cells in the second pair of columns by driving paired word lines. Each cell includes selection transistors. The selection transistors are connected in parallel between the memory element and the first BL. Gates of the transistors are connected to different WLs.

16 Claims, 17 Drawing Sheets

A-A

B-B

C-C

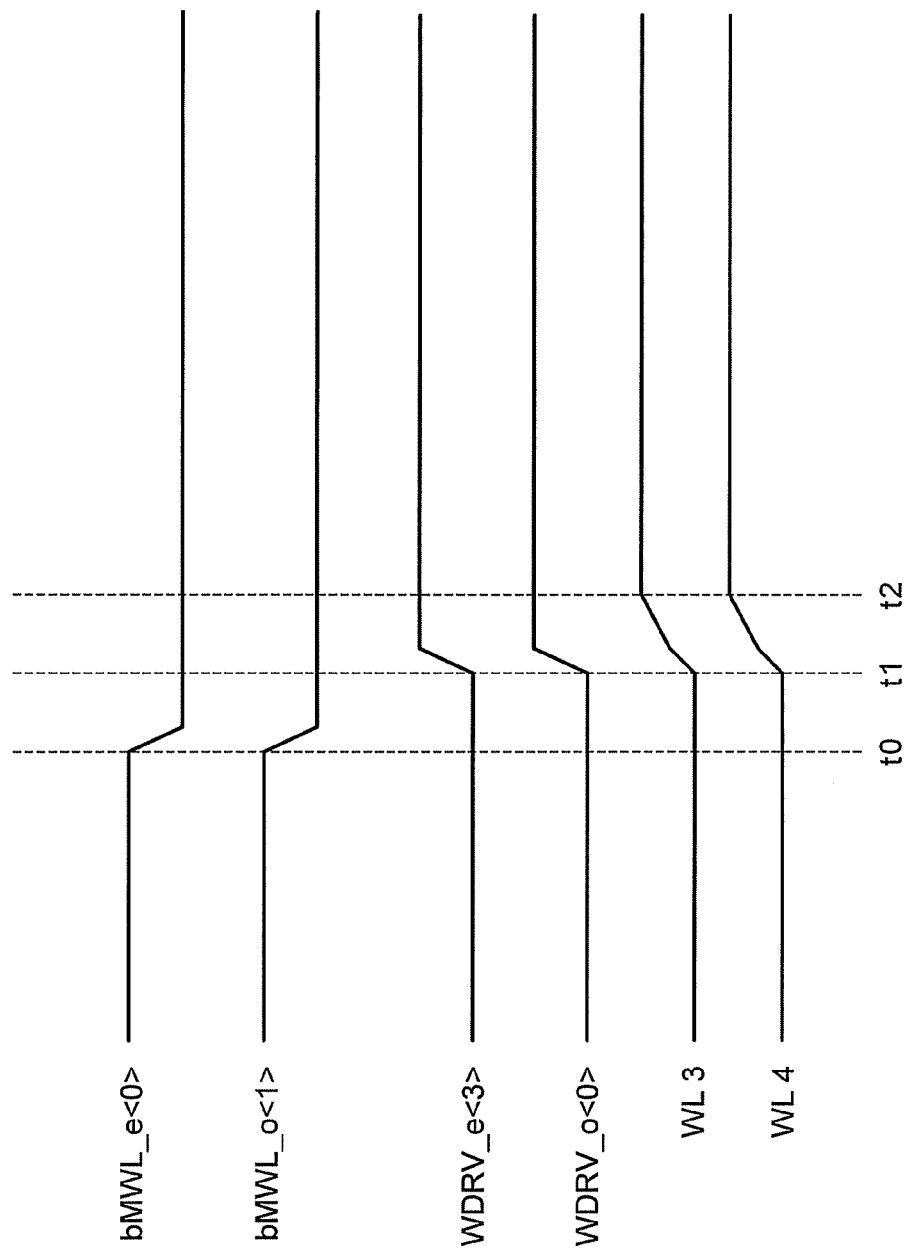

SEMICONDUCTOR STORAGE DEVICE

CROSS REFERENCE TO RELATED APPLICATIONS

This application is based upon and claims the benefit of priority from the prior Japanese Patent Application No. 2010-205745, filed on Sep. 14, 2010, the entire contents of which are incorporated herein by reference.

FIELD

The embodiment of the present invention relates to a semiconductor storage device.

BACKGROUND

As a resistive random-access memory device that stores data using a change in the resistance of each element, there is disclosed a magnetic random-access memory (MRAM). As MRAM writing methods, there are known a current-field writing method and a spin-transfer torque (STT) writing method. Among these methods, the STT wiring method has a property that a spin-transfer current necessary for magnetization reversal is lower when a magnetic body is smaller in size. Therefore, the spin-transfer-torque wiring method is advantageous for realizing high integration, low power consumption, and high performance. The current-field writing method has a disadvantage in that potential false writes take place in unselected memory cells due to expansion of a magnetic field. By contrast, the STT writing method can avoid such false writes in unselected memory cells.

An STT MRAM is often configured to provide two selection transistors in each memory cell so as to write data at high speed by carrying a current through an MTJ (Magnetic Tunnel Junction) element of the memory cell. In the MRAM configured to provide two selection transistors per MTJ element, the layout density of MTJ elements locally differs in a memory cell array. If different MTJ-element layout densities are present, an irregularity increases in the size of the MTJ element depending on lithography and etching in a process of manufacturing MTJ elements. The irregularity in the size of the MTJ element leads to an irregularity in a signal amount at the time of reading data. This results in erroneous data detection and degraded reliability.

BRIEF DESCRIPTION OF THE DRAWINGS

FIG. 18 is a timing diagram showing the selection operation performed by the MRAM according to the third embodiment for selecting the paired word lines WL3 and WL4.

DETAILED DESCRIPTION

A semiconductor storage device according to an embodiment of the present invention includes plurality of bit lines, plurality of word lines, and plurality of memory cells each including a memory element storing data by a difference between resistances of the memory element and connected between first and second bit lines. The memory cells arranged in an extending direction of the bit lines constitute columns. The second bit line is shared between two columns adjacent to each other. The memory cells in a first pair of columns sharing the second bit line are arranged to be shifted in the extending direction of the bit lines by a half-pitch of the memory cells from the memory cells in a second pair of columns adjacent to the first pair of columns. The device further includes a dummy cell arranged between the two adjacent and paired columns, and having an equal distance from the adjacent memory elements. Further, the device further includes a row decoder configured to drive the memory cells in the first pair of columns by applying a voltage to two adjacent and paired word lines WLk and WLk+1, where k is an integer, and configured to drive the memory cells in the second pair of columns adjacent to the first pair of columns by applying the voltage to two adjacent and paired word lines WLk+1 and WLk+2. Each of the memory cells includes plurality of selection transistors for the memory element, the selection transistors being connected in parallel between the memory element corresponding to the selection transistors and the first bit line. Gates of the transistors are connected to different word lines, respectively.

Embodiments will now be explained with reference to the accompanying drawings. The present invention is not limited to the embodiments.

First Embodiment

Figure 1:
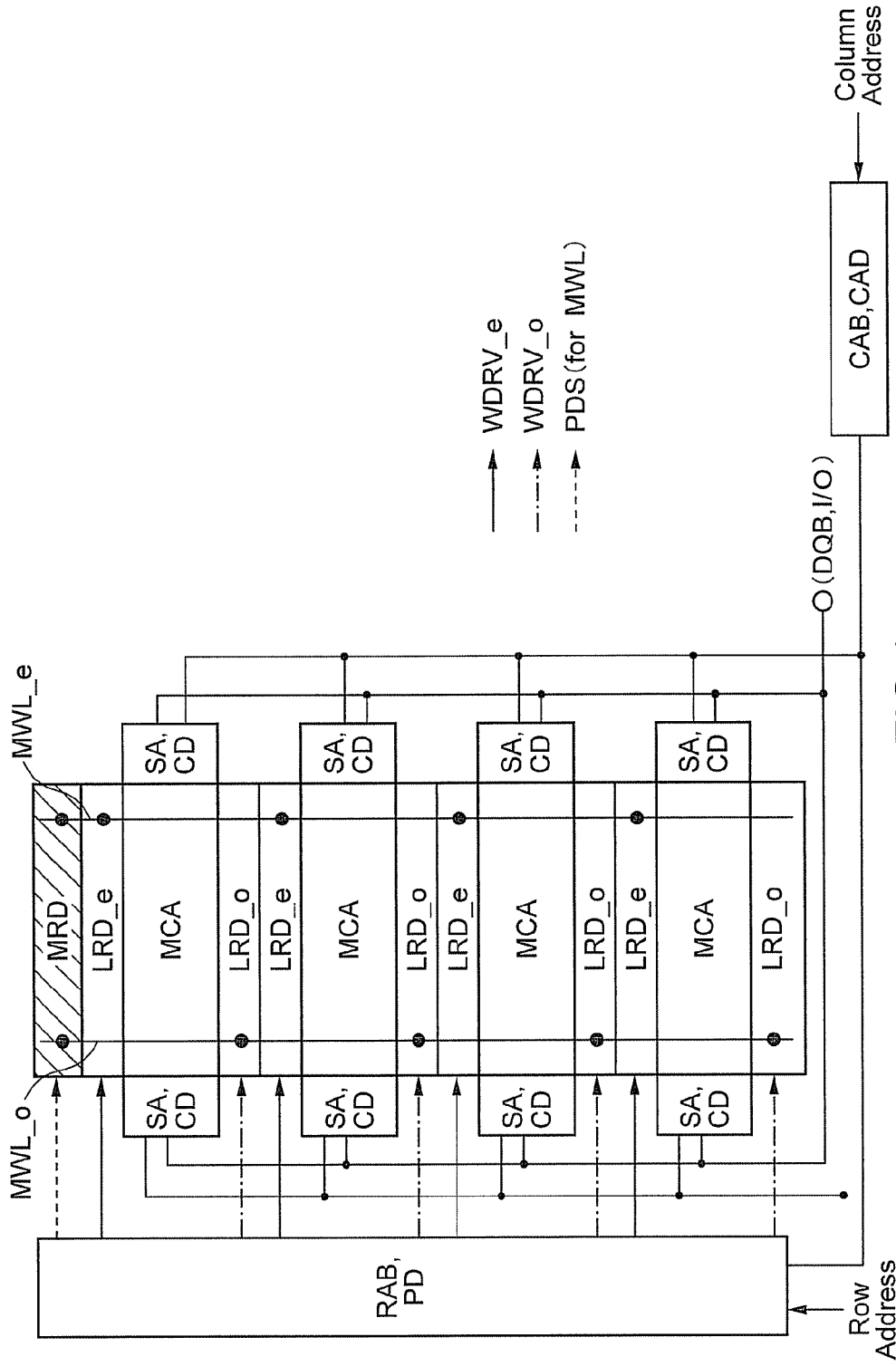
FIG. 1 is a block diagram showing an example of a configuration of an MRAM according to a first embodiment.

FIG. 1 is a block diagram showing an example of a configuration of an MRAM according to a first embodiment of the present invention. The MRAM includes memory cell arrays MCA, sense amplifiers SA, column decoders CD, local row decoders LRD_e and LRD_o, a main decoder MRD, a column address buffer CAB, a column address decoder CAD, a row address buffer RAB, and a pre-driver PD.

Each memory cell array MCA includes plurality of memory cells MC arranged two-dimensionally and plurality of memory cell arrays MCA are arranged in a row direction. The local row decoders LRD_e and LRD_o are provided on both sides of each memory cell array MCA in the row direction, respectively. The sense amplifier SA and the column decoder CD are provided on each side of each memory cell array MCA in a column direction.

The row address buffer RAB and the pre-driver PD are configured to receive a row address and a column address, to output a pre-decode signal PDS to the main row decoder MRD based on a part of the row address and the column address, and to output word drive signals WDRV_e and WDRV_o to the local decoders LRD_e and LRD_o, respectively.

The main row decoder MRD is connected to main word lines MWL_e and MWL_o, and to the local row decoders LRD_e and LRD_o via the respective main word lines MWL_e and MWL_o. The main row decoder MRD is configured to select the main word line MWL_e or MWL_o based on the pre-decode signal PDS. By selecting the main word line MWL_e, the main row decoder MRD simultaneously drives plurality of local row decoders LRD_e corresponding to the memory cell arrays MCA, respectively. By selecting the main word line MWL_o, the main row decoder MRD simultaneously drives plurality of local row decoders LRD_o corresponding to the memory cell arrays MCA, respectively.

Each of the local row decoders LRD_e and LRD_o receives the word drive signal WDRV_e or WDRV_o, selects a certain word line from among plurality of word lines, and applies a voltage to the certain word line.

The column address buffer CAB and the column address decoder CAD receive a column address, and drives the column decoders CD and the sense amplifiers SA based on a column address so as to selectively a drive bit line in a certain column.

Each column decoder CD is configured to selectively drive the bit line in the certain column from among bit lines in plurality of columns. Each sense amplifier SA is connected to bit lines and configured to detect data in a selected memory cell or write data to the selected memory cell.

Read data is output to outside of an MRAM chip from the sense amplifiers SA via a DQ buffer DQB and an input/output circuit I/O. Write data is input to the sense amplifiers SA from the outside of the MRAM chip via the DQ buffer DQB and the input/output circuit I/O.

Figure 2:
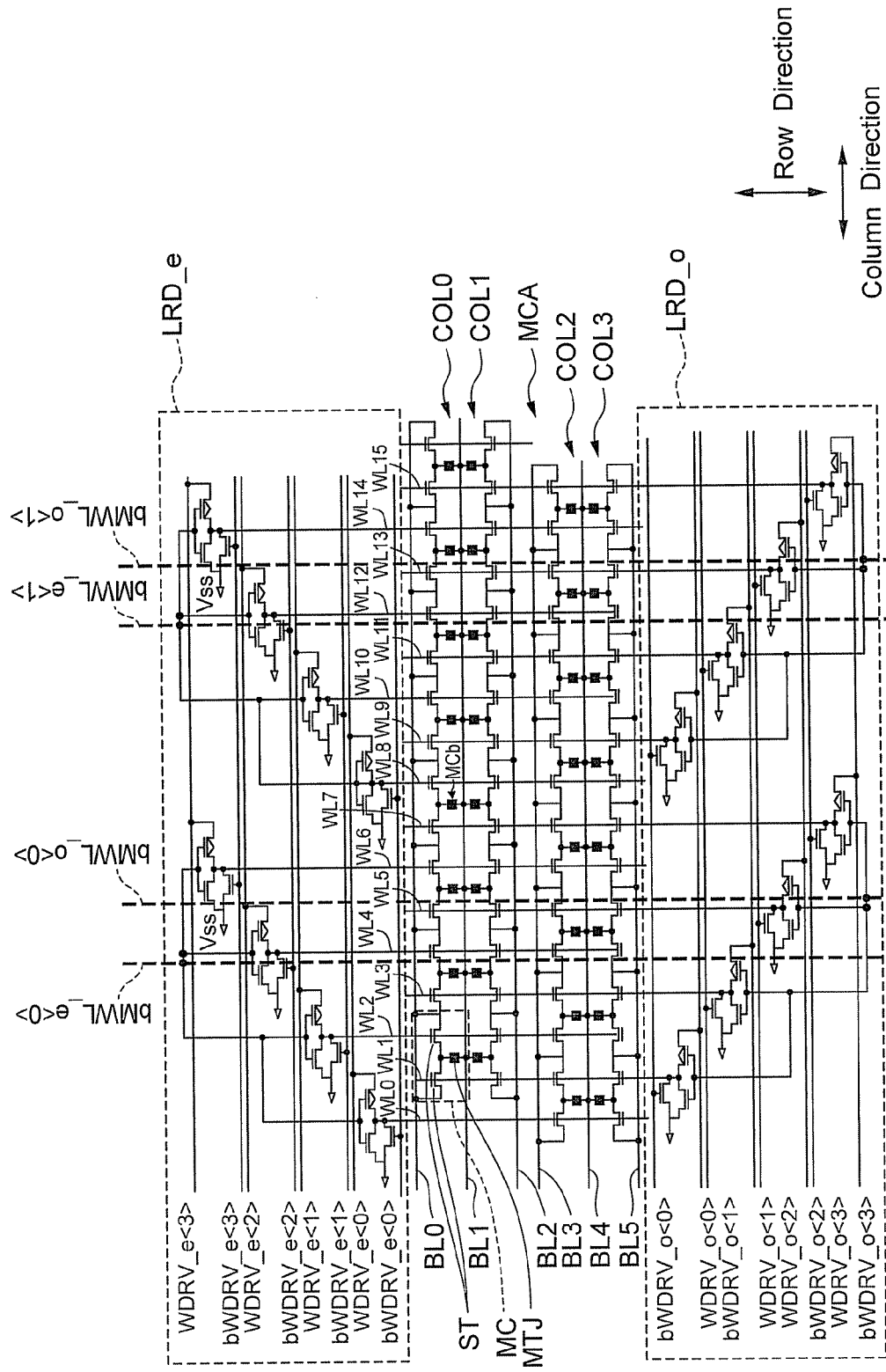
FIG. 2 is a circuit diagram showing configurations of one memory cell array MCA and the local row decoders LRD_e and LRD_o according to the first embodiment.

FIG. 2 is a circuit diagram showing configurations of one memory cell array MCA and the local row decoders LRD_e and LRD_o according to the first embodiment. For the sake of convenience, FIG. 2 shows bit lines BL0 to BL5, word lines WL0 to WL15, and the memory cells MC arranged in four columns COL0 to COL3. However, the numbers of bit lines, word lines, and memory cells MC are not limited to those shown in FIG. 2.

The configuration of each memory cell array MCA is described. The memory cell array MCA is configured to arrange the memory cells MC two-dimensionally. Each memory cell MC includes one MTJ element and two selection transistors ST. A broken-line frame (MC) shown in FIG. 2 denotes one memory cell unit. The MTJ element is one of resistive random-access memory elements storing data by the difference between resistances of each element. The two selection transistors ST are connected in parallel between the corresponding MTJ element and the bit line BL0 serving as a first bit line. Gates of these selection transistors ST are connected to different word lines, respectively. For example, the gates of the selection transistors ST in a certain memory cell MC are connected to the word lines WL0 and WL1 adjacent to each other, respectively. One end of the MTJ element is connected to the corresponding two selection transistors ST and the other end thereof is connected to the bit line BL1 serving as a second bit line. In this way, the memory cell MC is connected between the first bit line BL0 and the second bit line BL1. Likewise, each memory cell MC is connected between the bit lines BL2 and BL1, between the bit lines BL3 and BL4, or between the bit lines BL5 and BL4.

The memory cells MC arranged in the column direction (the extending direction of the bit lines) constitute the memory cell columns COL0 to COL3. The memory cells MC included in one column are connected to a pair of common bit lines. Furthermore, the two columns COL0 and COL1 adjacent to each other share the second bit line BL1. The two columns COL2 and COL3 adjacent to each other share the bit line BL4 serving as the second bit line.

Note that the bit lines BL0, BL2, BL3, and BL5 are bit lines corresponding to the columns COL0 to COL3 and used to select the columns COL0 to COL3, respectively. The bit lines BL1 and BL4 are shared between the two adjacent columns. Accordingly, in the following descriptions, to distinguish the bit lines BL0, BL2, BL3, and BL5 from the bit lines BL1 and BL4, the bit lines BL0, BL2, BL3, and BL5 are also referred to as "first bit lines" and the bit lines BL1 and BL4 are referred to as "second bit lines".

The columns COL0 and COL1 sharing the second bit line BL1 are paired, and the columns COL2 and COL3 sharing the second bit line BL4 are paired as well. The memory cells MC in the paired columns COL0 and COL1 are arranged to be shifted from those in the paired column COL2 and COL3 adjacent to the paired column COL0 and COL1 by a half-pitch of memory cells MC in the extending direction of the bit lines. In other words, the memory cells MC are arranged to be shifted by the half-pitch of memory cells MC in the extending direction of the bit lines at intervals of two columns. When the memory cell array MCA includes many columns, the same is true for the other pairs of columns and the memory cells MC are arranged to be shifted by the half-pitch of memory cells MC in the extending direction of the bit lines at intervals of two columns. The MTJ elements included in the respective memory cells MC are thereby arranged in a staggered manner in the memory cell array MCA.

In the memory cell array MCA, the pairs of columns COL0 and COL1 and COL2 and COL3 share word lines WLi (i=0 to 15). However, because the memory cells MC are shifted by the half-pitch of memory cells MC at intervals of two columns, the selection transistors ST connected to the same word line are shifted by the half-pitch of memory cells MC at intervals of two columns. Accordingly, the local row decoders LRD_e and LRD_o drive the memory cells MC in the paired columns COL0 and COL1 by applying a voltage to two adjacent word lines WLk and WLk+1 (k is an integer). The local row decoders LRD_e and LRD_o drive the memory cells MC in the paired columns COL2 and COL3 adjacent to the paired columns COL0 and COL1 by applying a voltage to two adjacent word lines WLk+1 and WLk+2. At this time, the local row decoder LRD_e drives even-numbered (even-numbered address) word lines WL0, WL2, WL4 . . . and the local row decoder LRD_o drives odd-numbered (odd-numbered address) word lines WL1, WL3, WL5 . . . . Therefore, in the first embodiment, the memory cell MC is selected by causing the local row decoders LRD_e and LRD_o to drive the word lines WLk and WLk+1, respectively.

Meanwhile, the column decoders CD shown in FIG. 1 select one of the columns COL0 to COL3 by applying a voltage to two adjacent bit lines BLj and BLj+1 (j is an integer). For example, to select the column COL0, the column decoders CD selectively drive the paired bit lines BL0 and BL1. To select the column COL1, the column decoders CD selectively drive the paired bit lines BL1 and BL2. At this time, the selected paired bit lines BLj and BLj+1 are a combination of one of the first bit lines BL0, BL2, BL3, and BL5 and one of the second bit lines BL1 and BL4.

The configurations of the local row decoders LRD_e and LRD_o are described next. The local row decoders LRD_e and LRD_o serving as first and second local row decoders are arranged on both sides of the memory cell array MCA in the row direction (upper and lower sides of the memory cell array MCA in FIG. 2), respectively. The local row decoder LRD_e drives one half of the word lines WLi (even-numbered word lines WL0, WL2, WL4 . . . ) provided in the memory cell array MCA whereas the local row decoder LRD_o drives the other half of the word lines WLi (odd-numbered word lines WL1, WL3, WL5 . . . ). Because the local row decoders LRD_e and LRD_o are symmetrical in configuration, only the LRD_e is described herein. To distinguish the word lines WLi from main word lines bMWL_e<0> and bMWL_e<1>, the word lines WLi are also referred to as "local word lines WL". The main word lines bMWL_e<0> and bMWL_e<1> are present on an upper wiring layer than that on which the local word lines WLi are present and extend in the same direction as the extending direction of the local word lines WLi. Accordingly, to distinguish word lines WLi from main word lines bMWL_e<0> and bMWL_e<1>, the main word lines bMWL_e<0> and bMWL_e<1> are indicated by broken lines in FIG. 2.

The local row decoder LRD_e is a logic circuit that connects word drive lines WDRV_e<0> to WDRV_e<3> to the respective local word lines WLi according to each of main word-line signals bMWL_e<0> and bMWL_e<1>. Note that bMWL_e<0> and bMWL_e<1> denote inverted signals of the main word line signals MWL_e<0> and MWL_e<1>, respectively. Further, bWDRV_e<0> to bWDRV_e<3> denote inverted signals of the word-drive line signals WDRV_e<0> to WDRV_e<3>, respectively.

Inverter circuits are connected between each of the main word lines bMWL_e<0> and bMWL_e<1> and each local word line WLi. This enables each local word line WLi to be connected to one of the word drive lines WDRV_e<0> to WDRV_e<3> when either the main word line bMWL_e<0> or bMWL_e<1> is driven to logic low. When either the main word line bMWL_e<0> or bMWL_e<1> is logic high, the local word lines WLi are kept at a low-level voltage VSS. In this way, the local row decoder LRD_e can selectively drive one of the local word lines WLi by the main word line bMWL_e<0> or bMWL_e<1> and one of the word drive lines WDRV_e<0> to WDRV_e<3>.

For example, to drive the local word line WL0, then the main word line bMWL_e<0> is driven to logic low, and the word drive line WDRV_e<0> is driven to logic high. At this time, the main word line bMWL_e<1> is inactivated to logic high and the word drive lines WDRV_e<1> to WDRV_e<3> are inactivated to logic low. The local row decoder LRD_e can thereby selectively drive only the local word line WL0 to logic high.

In the first embodiment, the local row decoder LRD_e drives six local word lines WL0, WL2, WL4, WL6, WL8, and WL10 by the two main word lines bMWL_e<0> and bMWL_e<1> and the four word drive lines WDRV_e<0> to WDRV_e<3>. Alternatively, a ratio of the number of main word lines to that of word drive lines can be changed. For example, the number of main word lines and that of word drive lines can be set to four and two, respectively. That is, it suffices that a product (m×n) between the number m of main word lines and the number n of word drive lines is equal to the number of local word lines to be driven. The same is true for the local row decoder LRD_o. However, common word drive lines cannot be used as the word drive lines corresponding to the local row decoders LRD_e and LRD_o. The reason is described later with reference to FIG. 10.

N-type transistors connected to the word drive lines bWDRV_e<0> to bWDRV_e<3> are provided to ensure fixing the corresponding local word lines to the low-level voltage VSS when the local word lines are unselected. For example, even when the main word line bMWL_e<0> is driven to logic low, the word drive line WDRV_e<1> corresponding to the unselected local word line WL2 is logic low. In this case, a gate and a drain of a P-type transistor of the inverter circuit connected to the main word line bMWL_e<0> and the word-drive line WDRV_e<1> are both logic low. Due to this, the P-type transistor possibly turns into an unstable conduction state. At this time, the N-type transistor is turned on by the word drive line bWDRV_e<1>, making it possible to ensure lowering a voltage of the word line WL2 to the low-level voltage VSS.

By way of example, operations performed by the local row decoders LRD_e and LRD_o for a case of selecting a memory cell MCb are described. In this case, the local row decoder LRD_e activates the main word line bMWL_e<1> to logic low and the word drive line WDRV_e<0> to logic high. The local word line WL8 is thereby driven. On the other hand, the local row decoder LRD_o activates the main word line bMWL_o<0> to logic low and the word drive line WDRV_o<3> to logic high. The local word line WL7 is thereby driven. Moreover, the column decoders CD and the sense amplifiers SA apply a voltage difference between the first bit line BL0 and the second bit line BL1. At this time, a voltage of the first bit line BL2 in the adjacent column is set equal to that of the second bit line BL1. The memory cell MCb is thereby selected and a write voltage or a read voltage is applied to the MTJ element of the memory cell MCb.

Because the two selection transistors ST supply a current to one MTJ element, data write speed can be accelerated.

Figure 3:
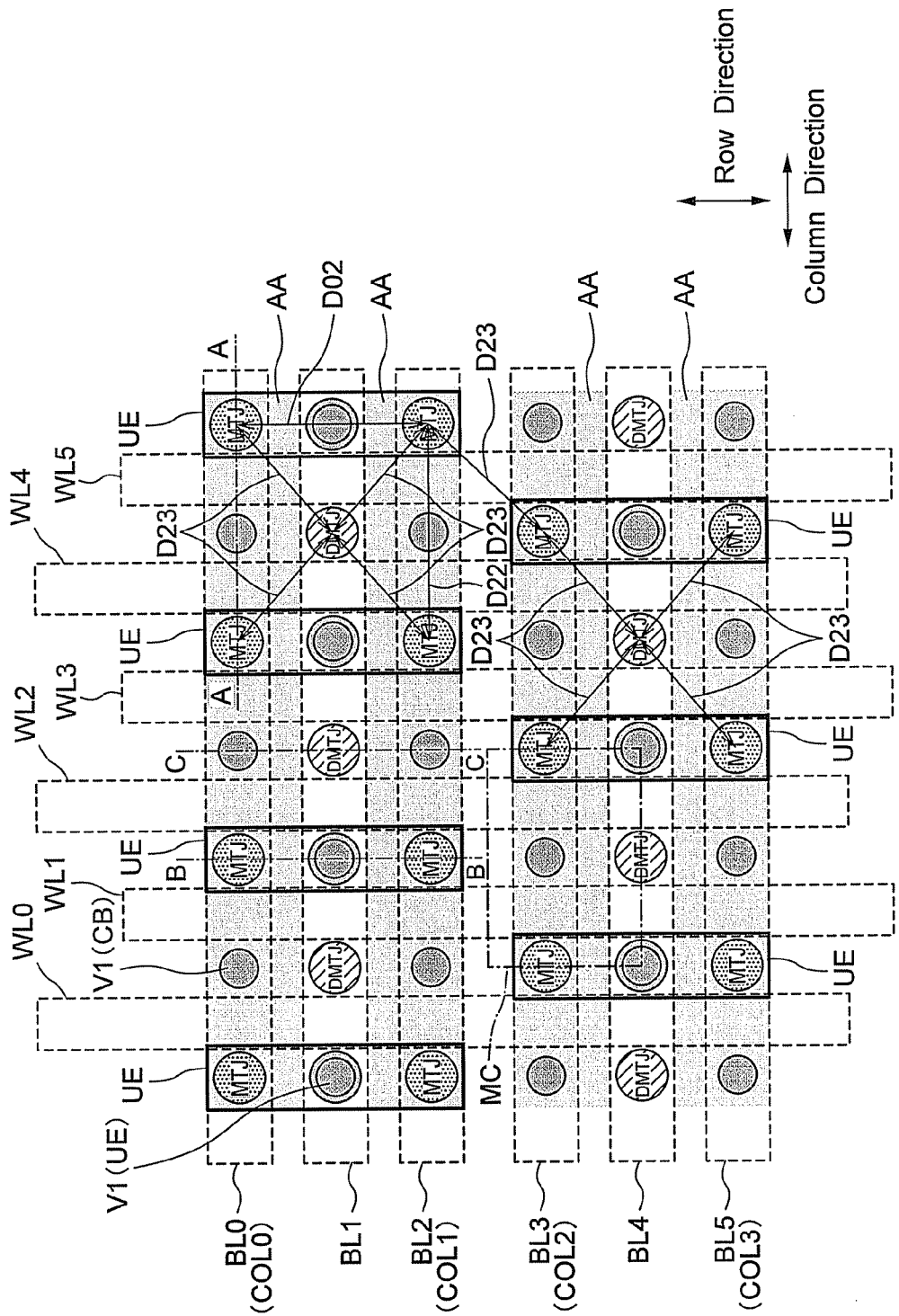
FIG. 3 is a plan layout view showing a part of one memory cell array MCA in the MRAM according to the first embodiment.
Figure 4:
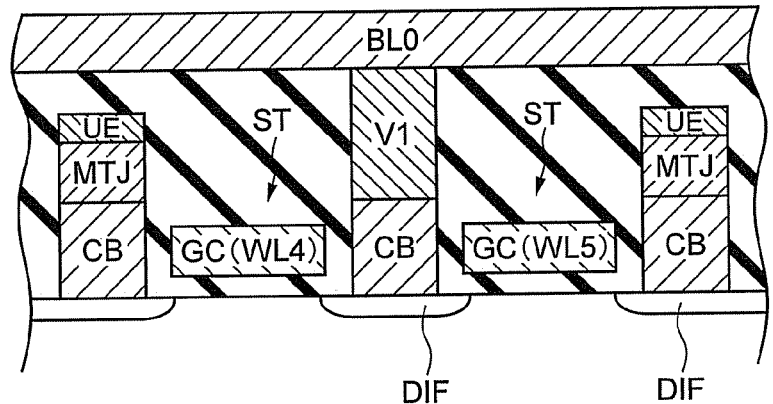
FIG. 4 is a cross-sectional view taken along a line A-A of FIG. 3.
Figure 5:
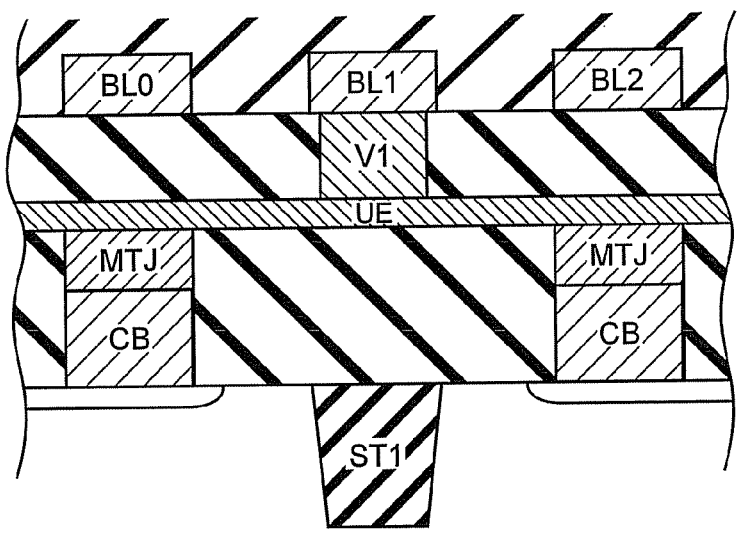
FIG. 5 is a cross-sectional view taken along a line B-B of FIG. 3.
Figure 6:
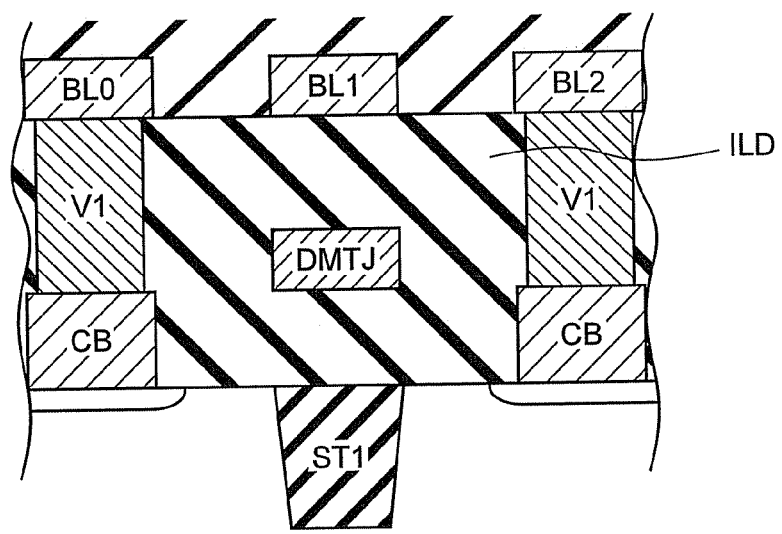
FIG. 6 is a cross-sectional view taken along a line C-C of FIG. 3.

FIG. 3 is a plan layout view showing a part of one memory cell array MCA in the MRAM according to the first embodiment. FIG. 4 is a cross-sectional view taken along a line A-A of FIG. 3, FIG. 5 is a cross-sectional view taken along a line B-B of FIG. 3, and FIG. 6 is a cross-sectional view taken along a line C-C of FIG. 3.

As shown in FIG. 3, active areas AA extend in the row direction and the MTJ elements are formed on the active areas AA. As can be understood from FIG. 3, the MTJ elements in the paired columns COL0 and COL1 are arranged to be shifted from those in the paired columns COL2 and COL3 by the half-pitch of memory cells MC in the column direction.

With this configuration, the second bit line BL1 is present between the columns COL0 and COL1 but no bit line is present between the columns COL1 and COL2. Therefore, the distance between the columns COL0 and COL1 is longer than that between the columns COL1 and COL2. This makes the density of MTJ elements locally different. For example, the layout density of MTJ elements is high in a portion including the bit lines BL2 and BL3 but low in a portion including the bit lines BL3 to BL5. This is because the distances between the adjacent MTJ elements differ among locations. For example, a shortest distance D23 between the MTJ element corresponding to the bit line BL2 and that corresponding to the bit line BL3 is smaller than a shortest distance D02 or D22 between the MTJ element corresponding to the bit line BL2 and that corresponding to the bit line BL0.

In the first embodiment, dummy MTJ elements DMTJ are arranged between the adjacent columns that are paired columns (between COL0 and COL1 and between COL2 and COL3) as dummy cells. Each of the dummy MTJ elements is arranged to be equal in the distance from the adjacent MTJ element. Furthermore, the dummy DMTJ elements are arranged below the second bit lines BL1 and BL4. The dummy MTJ elements DMTJ are identical in configuration to the ordinary MTJ elements. However, the dummy MTJ elements are not connected to the bit lines and word lines and not accessible from outside.

By arranging the dummy MTJ elements DMTJ, the distances between the adjacent MTJ elements (including dummy DMTJ elements) are all equal to D23. Therefore, in the memory cell array MCA, the MTJ elements and the dummy MTJ elements are arranged at a uniform layout density. As a result, an irregularity in the shape of the MTJ element does not occur in manufacturing process, making it possible to make the MTJ elements uniform in size and to accurately detect data.

A via V1 (CB) indicates, for example, contacts V1 and CB between the bit line BL0 and a diffusion layer shown in FIG. 4. A via V1 (UE) indicates, for example, a contact V1 between the bit line BL1 and an upper electrode UE shown in FIG. 5. In the first embodiment, the unit memory cell MC has a size of 4 F×3 F (F=Feature Size).

As shown in FIG. 4, diffusion layers DIF are formed on the active area AA in a cross section along the bit line BL0. Gates GC (WL4 and WL5) are formed via a gate dielectric film formed on the active area AA. The selection transistors ST are thereby constituted.

The MTJ element is formed on the contact CB connected to one of the diffusion layers of the selection transistor ST. The upper electrode UE is provided on the MTJ element. The other diffusion layer of the selection transistor ST is connected to the bit line BL0 via the contacts V1 and CB.

As shown in FIG. 5, the upper electrode UE on the MTJ elements connects the two MTJ elements adjacent in the row direction to each other. The upper electrode UE is connected to the bit line BL1 via the contact V1. The bit line BL1 thereby functions as the second bit line shared between the adjacent columns COL0 and COL1. STI (Shallow Trench Isolation) is provided between the adjacent active areas AA as element isolation.

As shown in FIG. 6, the dummy MTJ element DMTJ is provided above the element isolation STI and below the second bit line BL1. The dummy MTJ element DMTJ is surrounded by an interlayer dielectric film ILD and not connected to any wirings. The dummy MTJ element DMTJ has no influence on normal operations such as a read operation and a write operation while functioning to form the MTJ elements uniform in size in the manufacturing process.

Figure 7:
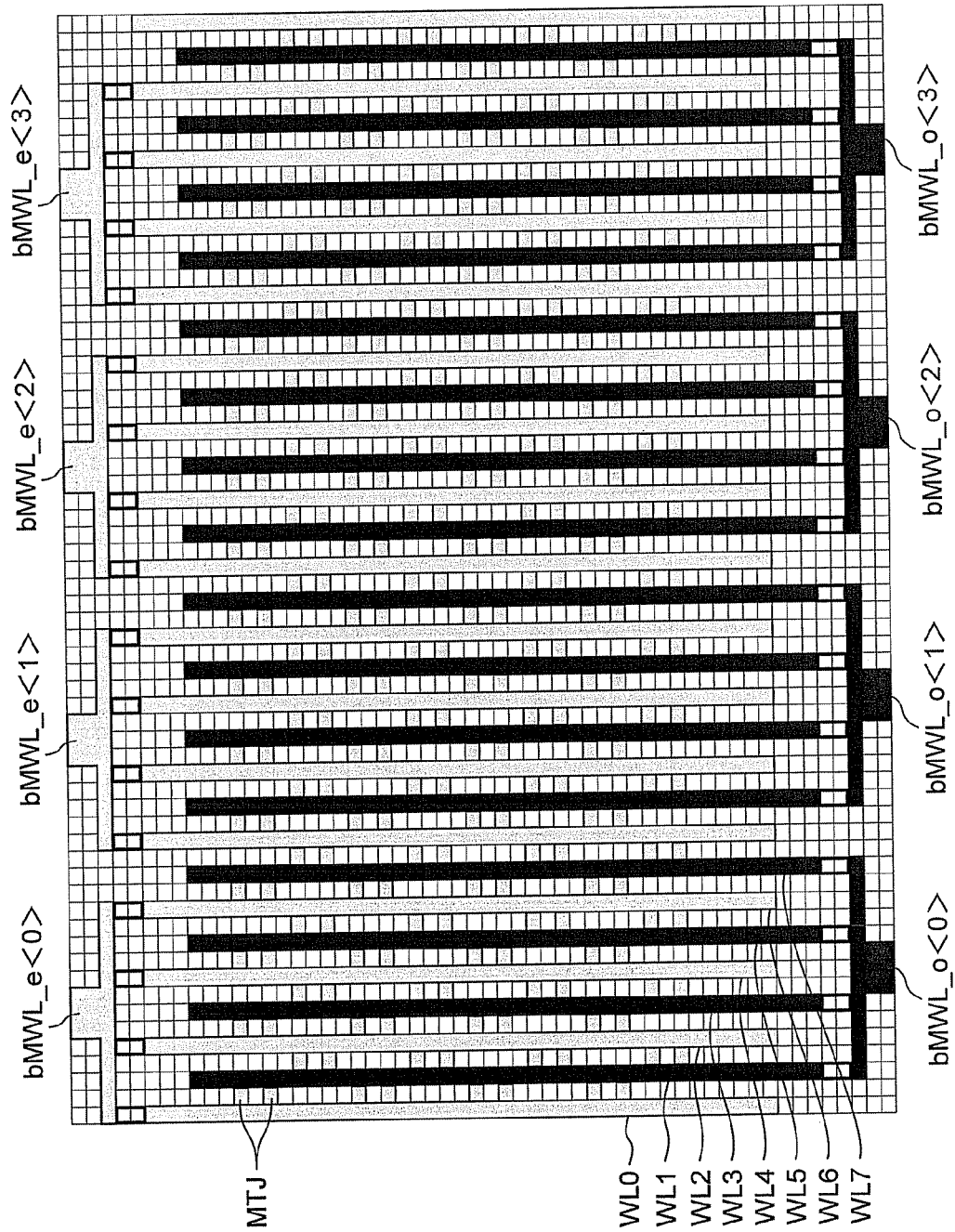
FIG. 7 is a pattern diagram showing an arrangement of the main word lines, the local word lines, and the MTJ elements.

FIG. 7 is a pattern diagram showing an arrangement of the main word lines, the local word lines, and the MTJ elements. FIG. 7 does not show the bit lines. As described above, in the first embodiment, the local decoders LRD_e and LRD_o are arranged on the both sides of each memory cell array MCA in the row direction, respectively. The main word lines bMWL_e<x> and bMWL_o<x> (x is an integer) are connected to the local rod lines WLi from the both sides of the memory cell array MCA. Each main word line is connected to the four local word lines WLi. Alternatively, the number of local word lines WLi per main word line can be set to 8, 16 or 32. In this case, it is necessary to set the number of word drive lines WDRV to correspond to that of local word lines WLi.

Figure 8:
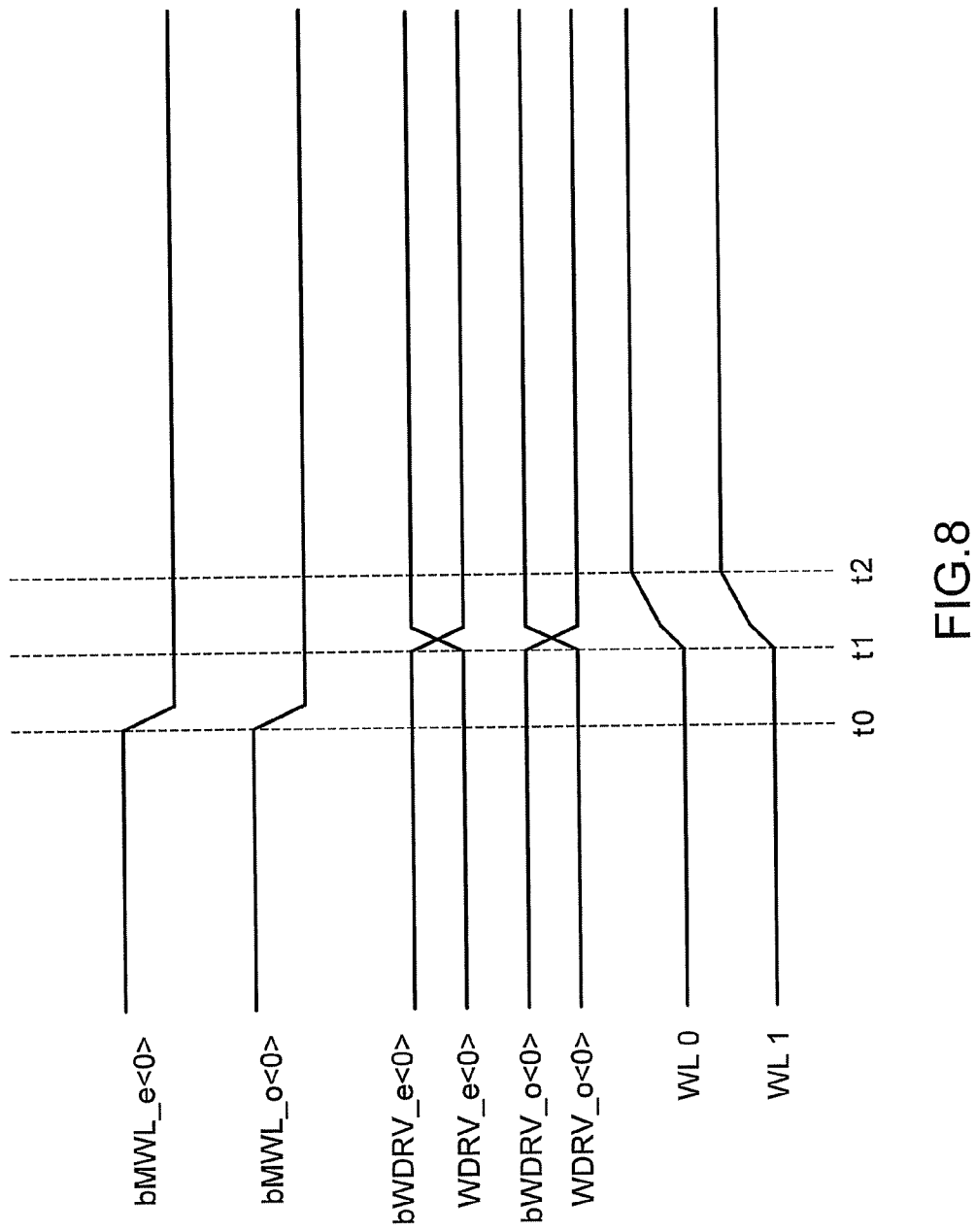
FIG. 8 is a timing diagram showing a selection operation performed by the MRA according to the first embodiment for selecting the paired word lines WL0 and WL1.

FIG. 8 is a timing diagram showing a selection operation performed by the MRA according to the first embodiment for selecting the paired word lines WL0 and WL1. At a time t0, the main word lines bMWL_e<0> and bMWL_o<0> are activated to logic low. The inverter circuits connected to the main word line bMWL_e<0> and bMWL_o<0> shown in FIG. 2 are thereby driven.

At a time t1, the word drive lines WDRV_e<0> and WDRV_o<0> are activated to logic high. The word drive lines WDRV_e<0> and WDRV_o<0> thereby drive the local word lines WL0 and WL1 to logic high, respectively.

Figure 9:
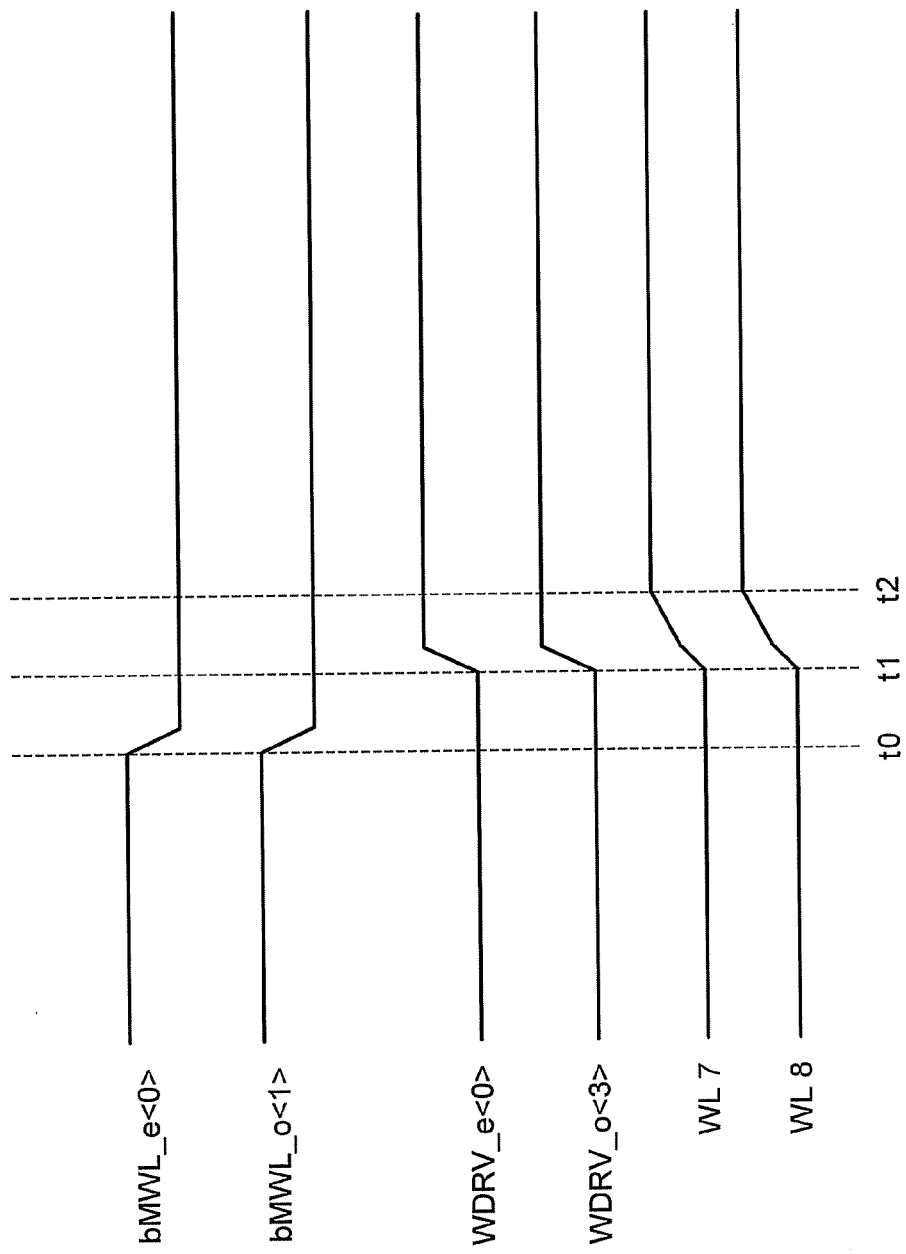
FIG. 9 is a timing diagram showing a selection operation performed by the MRAM according to the first embodiment for selecting the paired word lines WL7 and WL8.

FIG. 9 is a timing diagram showing a selection operation performed by the MRAM according to the first embodiment for selecting the paired word lines WL7 and WL8. At the time t0, the main word lines bMWL_e<0> and bMWL_o<1> are activated to logic low. The inverter circuits connected to the main word line bMWL_e<0> and bMWL_o<1> shown in FIG. 2 are thereby driven.

At the time t1, the word drive lines WDRV_e<0> and WDRV_o<3> are activated to logic high. The word drive lines WDRV_e<0> and WDRV_o<3> thereby drive local word lines WL7 and WL8 to logic high, respectively. It suffices that the sense amplifiers SA apply the voltage difference to the paired bit lines BL0 and BL1 so as to select the memory cell MCb shown in FIG. 2.

In the MRAM according to the first embodiment, the dummy MTJ elements DMTJ are arranged so that the layout density of the MTJ elements and the dummy MTJ elements DMTJ is uniform. This can suppress the irregularity in the size of the MTJ element and enable accurate detection of data. This leads to improving the reliability of the MRAM.

In the MRAM according to the first embodiment, the local row decoders LRD_e and LRD_o are arranged on the both sides (upper and lower sides) of each memory cell array MCA, respectively. Likewise, the main word lines bMWL_e<0> and bMWL_o<0> are arranged on the both sides (upper and lower sides) of the memory cell array MCA, respectively. This is because it is necessary to isolate the word drive lines WDRV_e and WDRV_o from each other.

Figure 10:
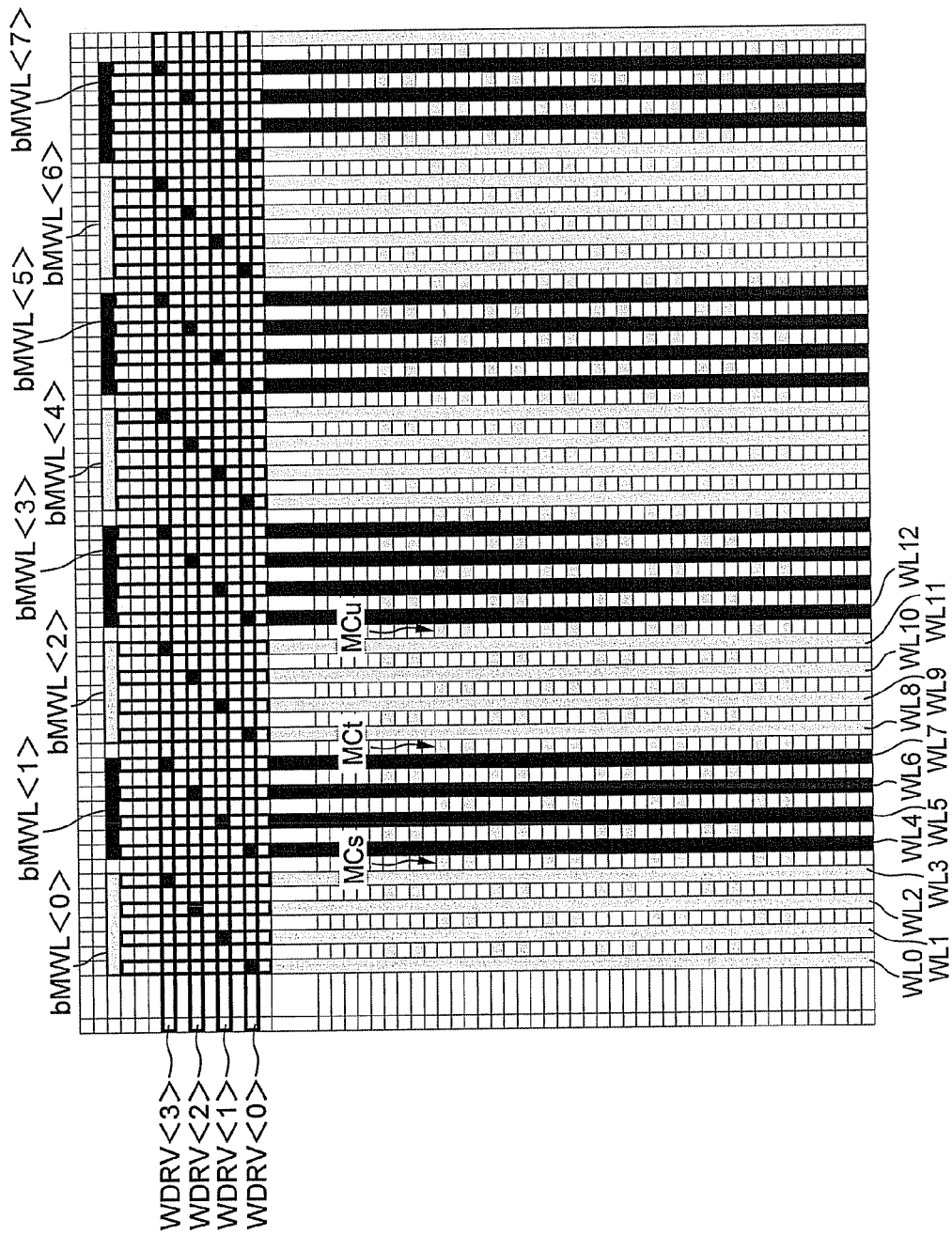
FIG. 10 is a pattern diagram showing an arrangement of the main word lines, the local word lines, and the MTJ elements in the MRAM in which the local row decoders are arranged on one side of the memory cell array MCA and in which the word drive lines are shared between the local row decoders.

When the local row decoders LRD_e and LRD_o share word drive lines, the local row decoders and the main word lines can be arranged on one side of the memory cell array MCA as shown in FIG. 10. FIG. 10 is a pattern diagram showing an arrangement of the main word lines, the local word lines, and the MTJ elements in the MRAM in which the local row decoders are arranged on one side of the memory cell array MCA and in which the word drive lines are shared between the local row decoders. The word drive line WDRV<0> corresponds to the local word lines WL0, WL4, and WL8. The word drive line WDRV<1> corresponds to the local word lines WL1, WL5, and WL9. The word drive line WDRV<2> corresponds to the local word lines WL2, WL6, and WL10. The word drive line WDRV<3> corresponds to the local word lines WL3, WL7, and WL11. A blackened rectangle denotes a connection point between one word drive line and one local drive line. The inverter circuit described with reference to FIG. 2 is provided at this connection point. In this case, the number of word drive lines is reduced by half of that shown in FIG. 7.

However, the MRAM shown in FIG. 10 has the following problems. For example, when a memory cell MCt is to be selected, then the main word lines bMWL<1> and bMWL<2> are activated to logic low, and the word drive lines WDRV<0> and WDRV<3> are raised. The local word lines WL7 and WL8 are thereby driven. The bit line BL connected to the memory cell MCt is driven, thereby making it possible to select the memory cell MCt.

On the other hand, when the main word lines bMWL<1> and bMWL<2> and the word drive lines WDRV<0> and WDRV<3> are activated, the local word lines WL4 and WL11 are also driven. At this time, when the bit line BL connected to the memory cell MCt is driven, then the word line WL4 is driven out of the paired word lines WL3 and WL4 to be driven to select a memory cell MCs, and the word line WL11 is driven out of the paired word lines WL11 and WL12 to be driven to select a memory cell MCu. That is, the memory cells MCs and MCu to be unselected are in a half-selected state. This possibly causes data to be written to or to be read from the unselected memory cells MCs and MCu.

To regulate such access to the unselected memory cells, eight word drive lines are necessary when the number of local word lines that can be activated by a certain main word line is four. More generally, the number of word drive lines needs to be twice as large as the number of local word lines that can be activated by selecting one main word line.

In the first embodiment, the local row decoders LRD_e and LRD_o are provided on the both sides of each memory cell array MCA, the main word lines bMWL_e and bMWL_o are provided on the both sides of each memory cell array MCA, and the word drive lines WDRV_e and WDRV_o are provided on the both sides of each memory cell array MCA, respectively. This can ensure regulating of access to unselected memory cells and providing compact memory cell arrays MCA in the MRAM.

Normally, wiring patterns of peripheral circuits other than the memory cell arrays MCA are random patterns. Due to this, it is necessary to form wirings of the local decoders at a wider pitch than a cycle pattern of the word lines or the like of the memory cell arrays MCA. Accordingly, when the local row decoders are arranged only on one side of each memory cell array MCA, a word line interval is possibly restricted by the wiring pitch of the local row decoders.

Considering the problems, the local word lines are formed so as to pull out one half of the local word lines to one side of each memory cell array MCA in the row direction and to pull out the other half thereof to the other side of each memory cell array MCA, and the local row decoders LRD_e and LRD_o are formed on the both sides of the memory cell array in the row direction, respectively. This can set the wiring pitches of the word lines and the like to be sufficiently narrow while setting the wiring pitch of the local row decoders LRD_e and LRD_o to be relatively wide. As a result, according to the first embodiment, it is possible to make the memory cell arrays MCA compact and reduce cost of the MRAM.

Figure 11:
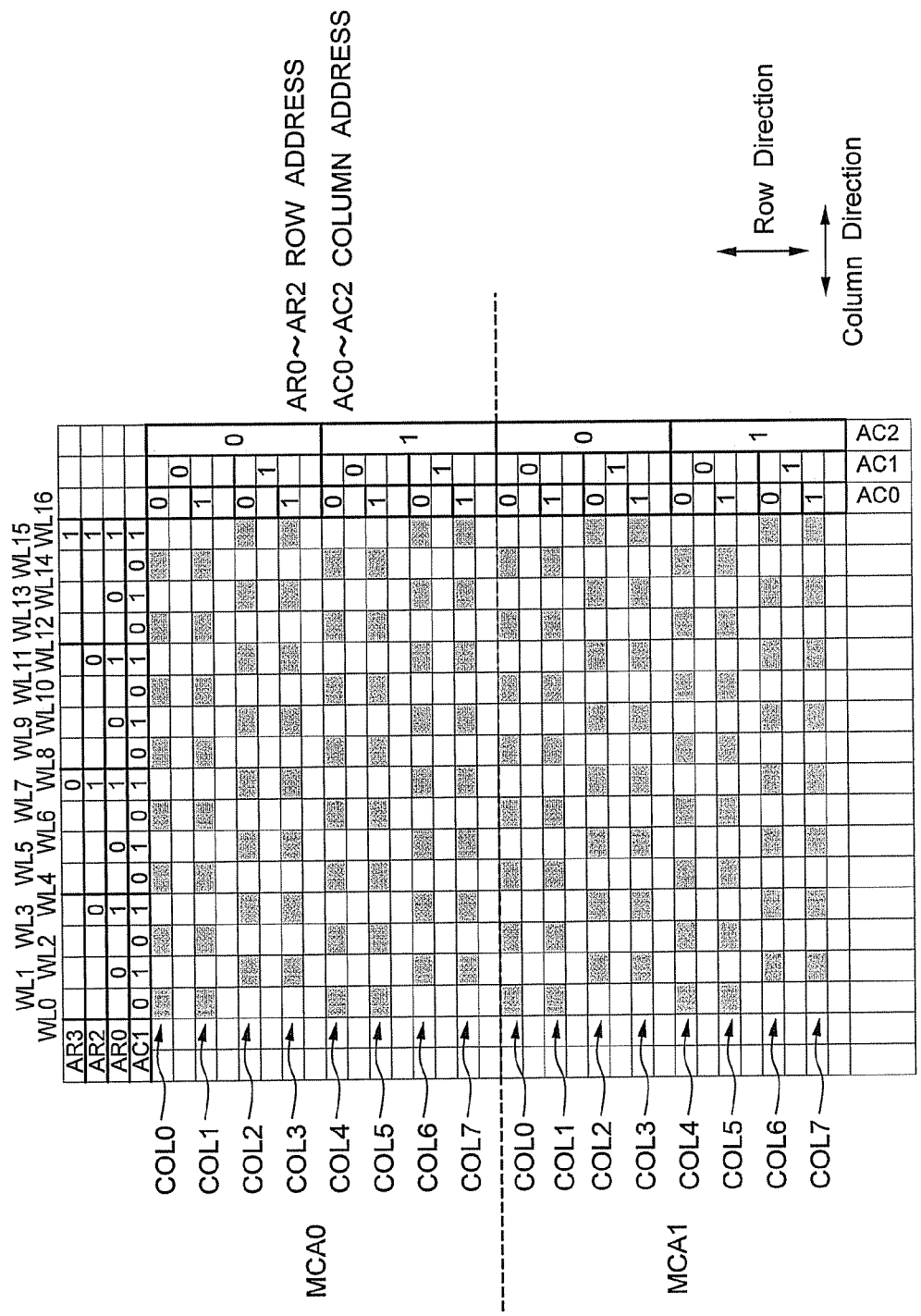
FIG. 11 is a mapping diagram of address mapping of the MRAM according to the first embodiment.

FIG. 11 is a mapping diagram of address mapping of the MRAM according to the first embodiment. FIG. 11 shows addresses of the respective memory cells MC in two memory cell arrays MCA0 and MCA1. Because the memory cell arrays MCA0 and MCA1 share the local word lines WLi, it is possible to simultaneously select the memory cells MC in the memory cell arrays MCA0 and MCA1. For example, the MRAM selects a specific memory cell MC by three low bits AR0 to AR2 of a row address and three low bits AC0 to AC2 of a column address. The blackened rectangle denotes the MTJ element of one memory cell MC. Addresses (0, 0, 0, 0) to (1, 1, 1, 1), each of which is a combination of three bits (AR0 to AR2) of the row address and one bit (AC1) of the column address, are allocated to the paired local word lines WL0 and WL1 to WL15 and WL16, respectively. The paired local word lines WLi and WLi+1 are selected by the three bits AR0 to AR2 of the row address and one bit AC1 of the column address. For example, the paired local word lines WL0 and WL1 are selected by (AR0, AR1, AR2, AC1)=(0, 0, 0, 0). The paired local word lines WL5 and WL6 are selected by (AR0, AR1, AR2, AC1)=(0, 1, 0, 1). On the other hand, the column COL (paired bit lines BLk and BLk+1) is selected by three low bits AC0 to AC2 of the column address. For example, the column COL0 is selected by (AC0, AC1, AC2)=(0, 0, 0). The column COL5 is selected by (AC0, AC1, AC2)=(1, 0, 1). It is thereby possible to select the specific memory cell MC in each of the memory cell arrays MCA0 and MCA1.

To select the paired local word lines WLi and WLi+1, one bit AC1 of the column address is used. The bit AC1 of the column address is the bit for selecting paired columns COLy and COLy+1 (y is an integer). That is, the bit AC1 of the column address for selecting the paired word lines WLi and WLi+1 is the same as the bit of the column address for selecting the paired columns COLy and COLy+1.

The memory cells MC are shifted by the half-pitch of memory cells MC in the column direction at intervals of two columns, and the memory cells MC in the adjacent and paired columns are selected by a pair of different local word lines. That is, when the selected paired columns differ from paired columns, the selected paired local word lines differ from those corresponding to the latter paired columns, accordingly. Therefore, it is possible to select paired local word lines according to the bit of the column address for selecting paired columns. Accordingly, the address for selecting paired local word lines includes three bits (AR0 to AR2) of the row address and one bit (AC1) of the column address. That is, the bit AC1 of the column address is used to select both paired word lines and the column.

Figure 12:
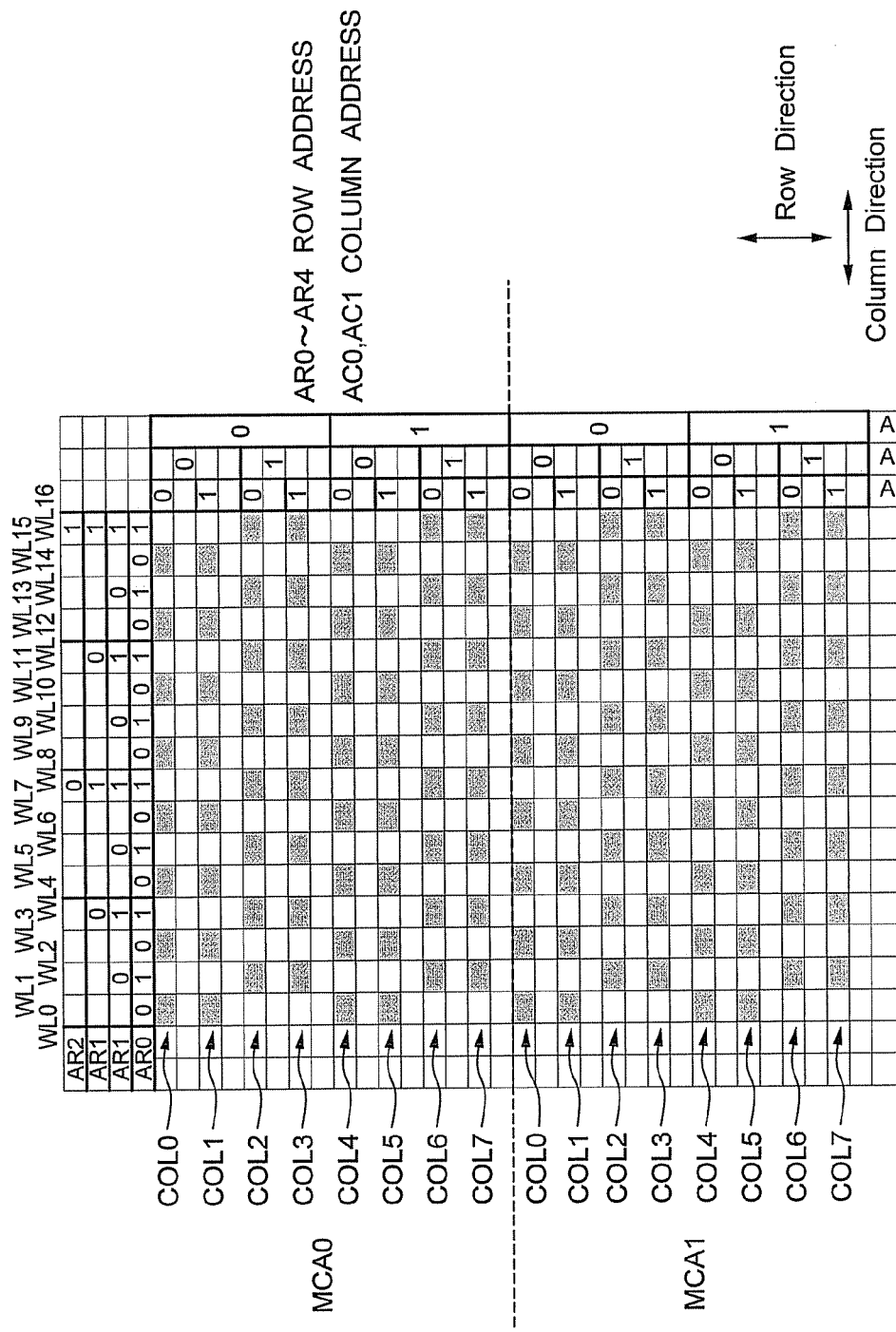
FIG. 12 is another mapping diagram of address mapping of the MRAM according to the first embodiment.

As shown in FIG. 12, the bit AC1 can be regarded as one bit of the row address. That is, the paired local word lines WLi and WLi+1 can selected by four low bits (AR0 to AR3) of the row address and the column COLy can be selected by one bit (AR0) of the row address. In this case, while being a bit for selecting the paired word lines WLi and WLi+1, the bit AR0 of the row address is also used to select paired columns. With this address mapping method, the specific memory cell MC can be selected similarly to FIG. 11.

Second Embodiment

Figure 13:
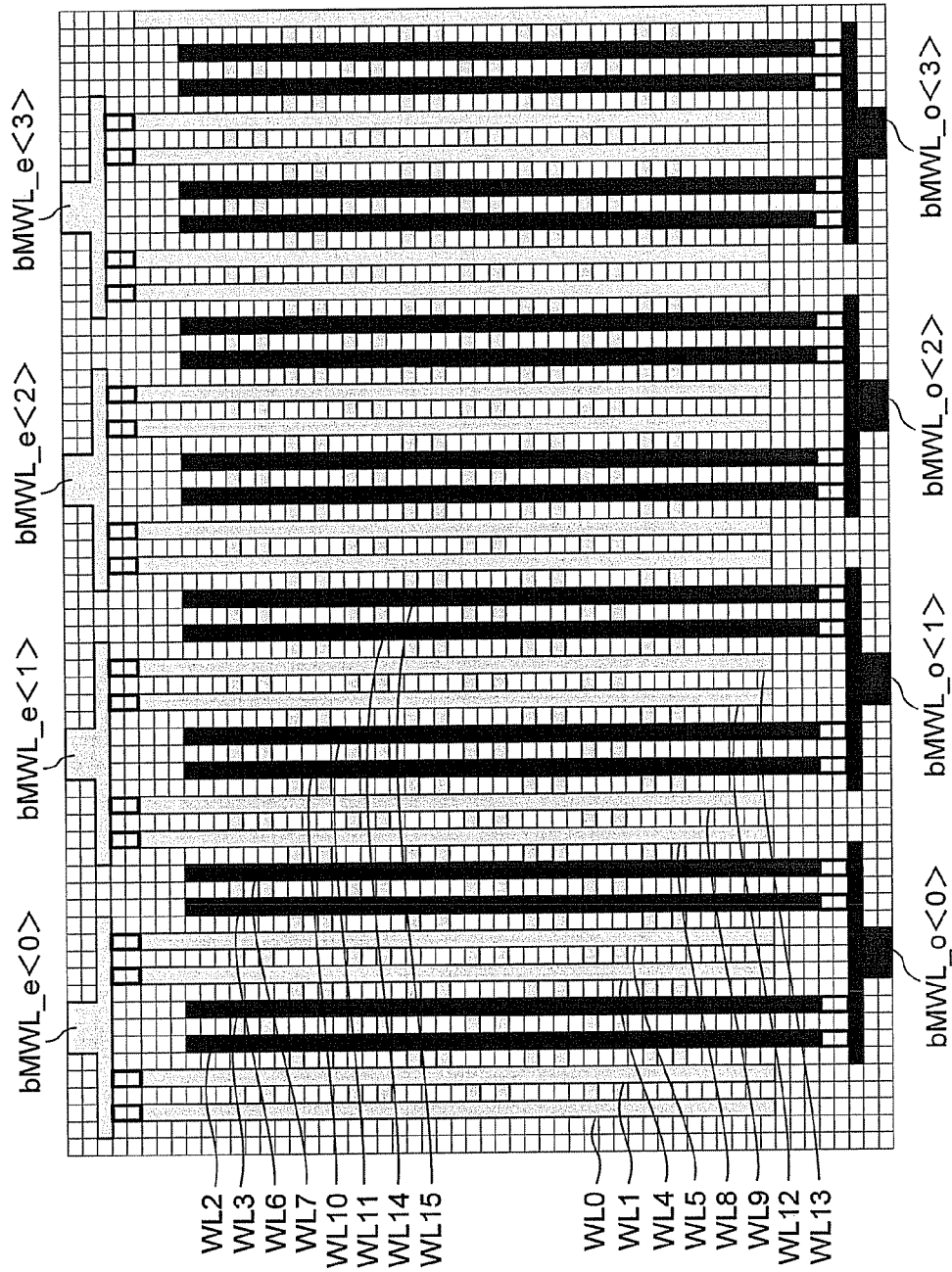
FIG. 13 is a pattern diagram showing an arrangement of the main word lines, the local word lines, and the MTJ elements according to a second embodiment.

FIG. 13 is a pattern diagram showing an arrangement of the main word lines, the local word lines, and the MTJ elements according to a second embodiment of the present invention. FIG. 13 does not show the bit lines. In the first embodiment, the local word lines WLi alternately extend in the row direction and are alternately connected to the main word line bMWL_e and the main word line bMWL_o on the opposite side to the main word line bMWL_e in the memory cell array MCA. In the second embodiment, the local word lines WLi alternately extend two-at-a-time in the row direction and are alternately connected two-at-a-time to the main word line bMWL_e and the main word line bMWL_o on the opposite side to the main word line bMWL_e in the memory cell array MCA. The MRAM according to the second embodiment can be configured similarly in the other constituent elements to that according to the first embodiment. However, the local row decoder LRD_e is connected to the word line WL0, WL1, WL4, WL5, WL8, WL9, WL12, WL13 . . . and the local row decoder LRD_o is connected to the word lines WL2, WL3, WL6, WL7, WL10, WL11, WL14, WL15 . . . . That is, the local row decoders LRD_e and LRD_o are connected to the word lines WLi two-at-a-time at intervals of two local word lines. The local row decoders LRD_e and LRD_o can be configured similarly to FIG. 2.

Figure 14:
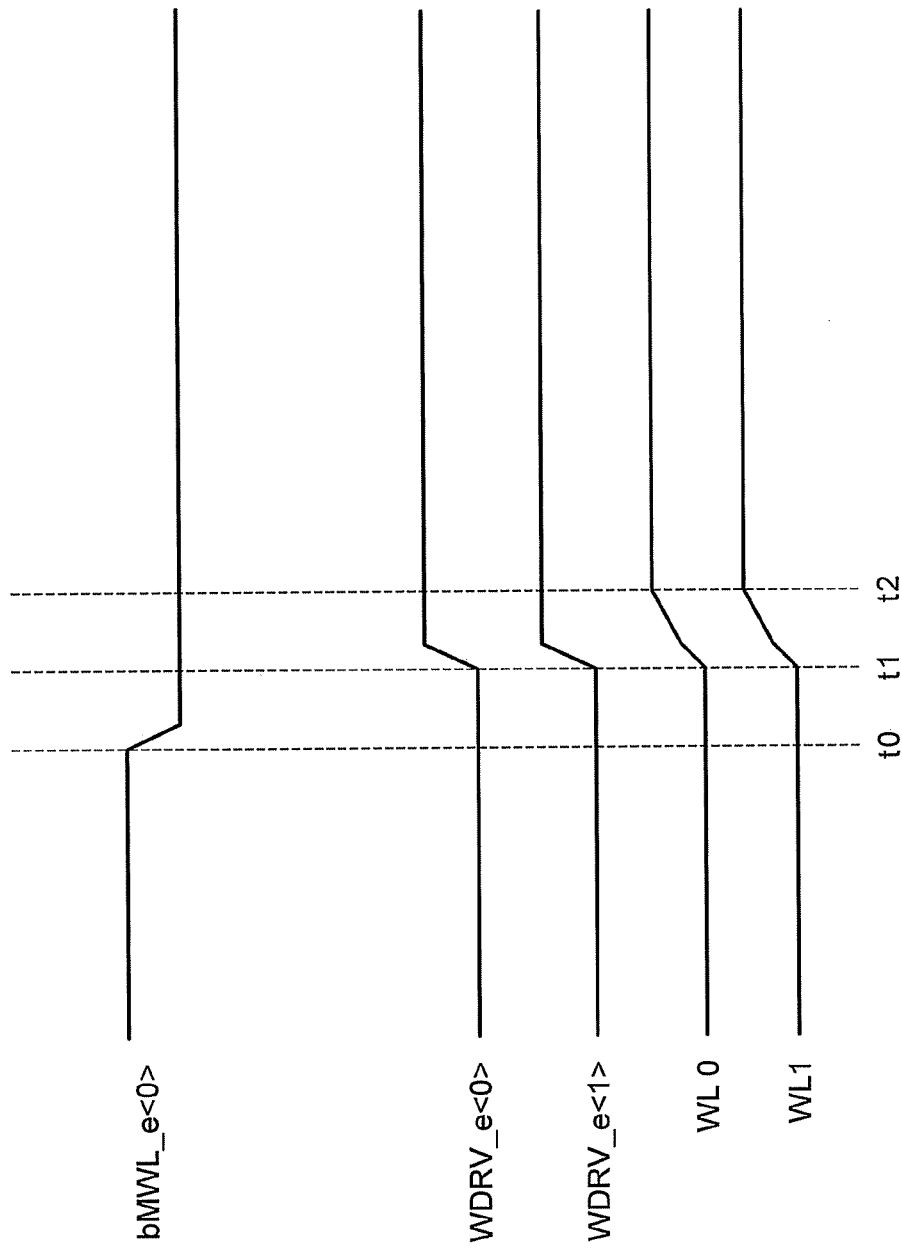
FIG. 14 is a timing diagram showing a selection operation performed by the MRAM according to the second embodiment for selecting the paired word lines WL0 and WL1.

FIG. 14 is a timing diagram showing a selection operation performed by the MRAM according to the second embodiment for selecting the paired word lines WL0 and WL1. At a time t0, only the main word line bMWL_e<0> is activated to logic low. The inverter circuits connected to the main word line bMWL_e<1> shown in FIG. 2 are thereby driven.

At a time t1, the word drive lines WDRV_e<0> and WDRV_e<1> are activated to logic high. At a time t2, the word drive lines WDRV_e<0> and WDRV_e<1> thereby drive the local word lines WL0 and WL1 to logic high.

Figure 15:
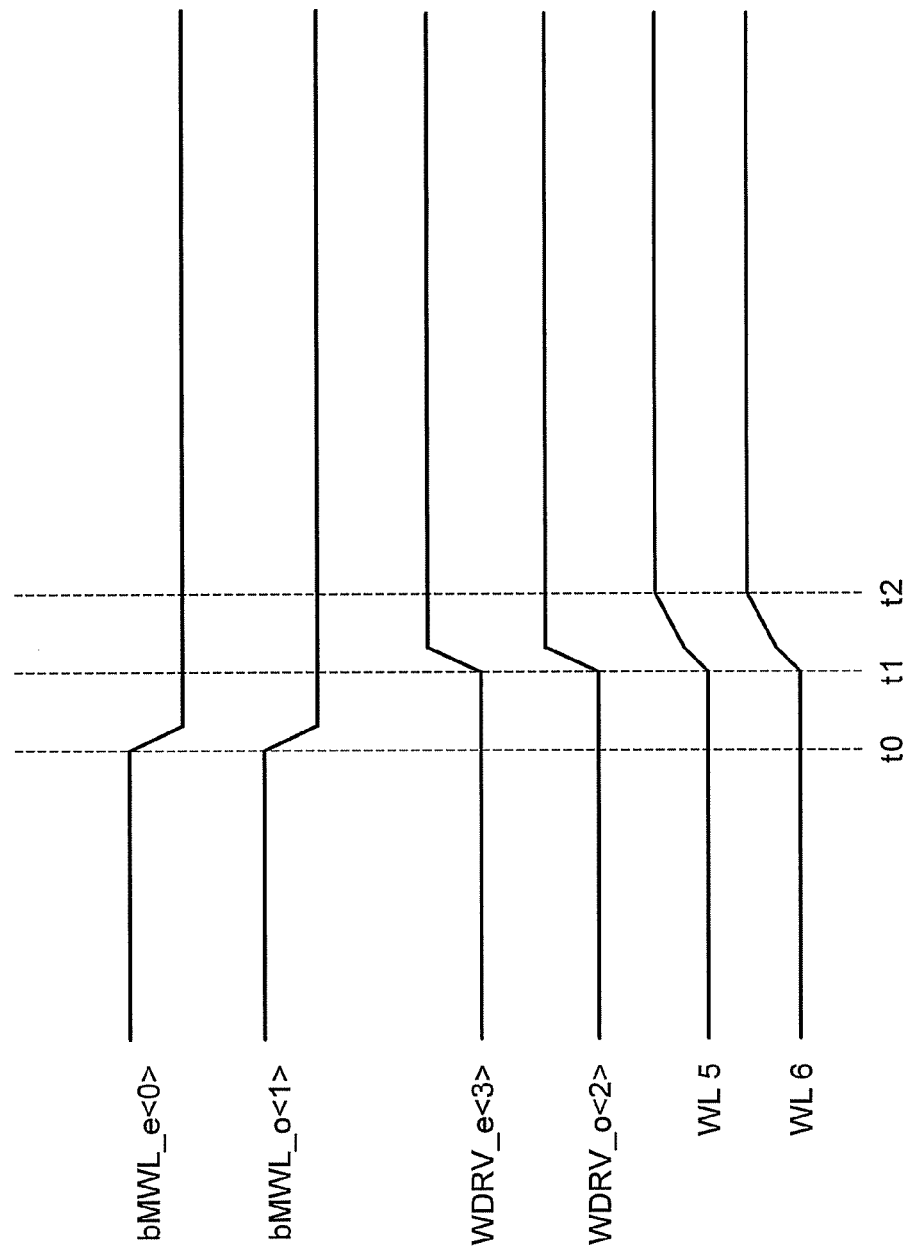
FIG. 15 is a timing diagram showing the selection operation performed by the MRAM according to the second embodiment for selecting the paired word lines WL5 and WL6.

FIG. 15 is a timing diagram showing the selection operation performed by the MRAM according to the second embodiment for selecting the paired word lines WL5 and WL6. At the time t0, the main word lines bMWL_e<0> and bMWL_e<1> are activated to logic low. The inverter circuits connected to the main word lines bMWL_e<0> and bMWL_e<1> shown in FIG. 2 are thereby driven.

At the time t1, the word drive lines WDRV_e<3> and WDRV_o<2> are activated to logic high. At the time t2, the word drive lines WDRV_e<3> and WDRV_o<2> thereby drive the local word lines WL5 and WL6 to logic high.

Even with the configuration according to the second embodiment, it is possible to select the specific memory cell MC in the memory cell array MCA shown in FIGS. 2 and 3 similarly to the first embodiment. Further, the layout of the memory cell array MCA of the second embodiment is identical to that of the first embodiment (FIG. 3). Therefore, the second embodiment can achieve effects identical to those of the first embodiment.

Third Embodiment

Figure 16:
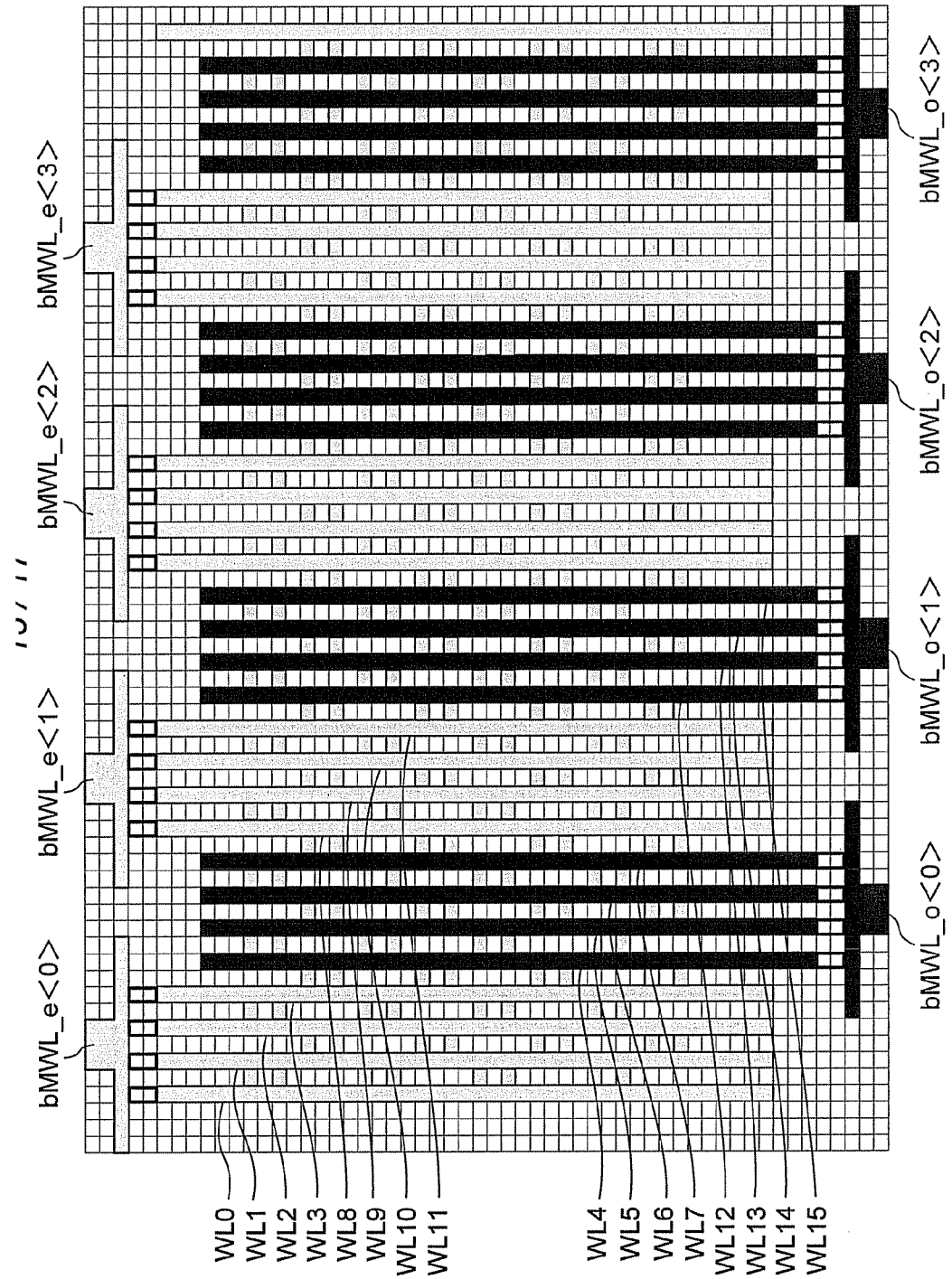
FIG. 16 is a pattern diagram showing an arrangement of the main word lines, the local word lines, and the MTJ elements according to a third embodiment.

FIG. 16 is a pattern diagram showing an arrangement of the main word lines, the local word lines, and the MTJ elements according to a third embodiment of the present invention. FIG. 16 does not show the bit lines. In the third embodiment, the local word lines WLi alternately extend four-at-a-time in the row direction and are alternately connected four-at-a-time to the main word line bMWL_e and the main word line bMWL_o on the opposite side to the main word line bMWL_e in the memory cell array MCA. The MRAM according to the third embodiment can be configured similarly in the other constituent elements to that according to the first embodiment. However, the local row decoder LRD_e is connected to the word line WL0, WL1, WL2, WL3, WL8, WL9, WL10, WL11 . . . and the local row decoder LRD_o is connected to the word lines WL4, WL5, WL6, WL7, WL12, WL13, WL14, WL15 . . . . That is, the local row decoders LRD_e and LRD_o are connected to the word lines WLi four-at-a-time at intervals of four local word lines. The local row decoders LRD_e and LRD_o can be configured similarly to FIG. 2.

Figure 17:
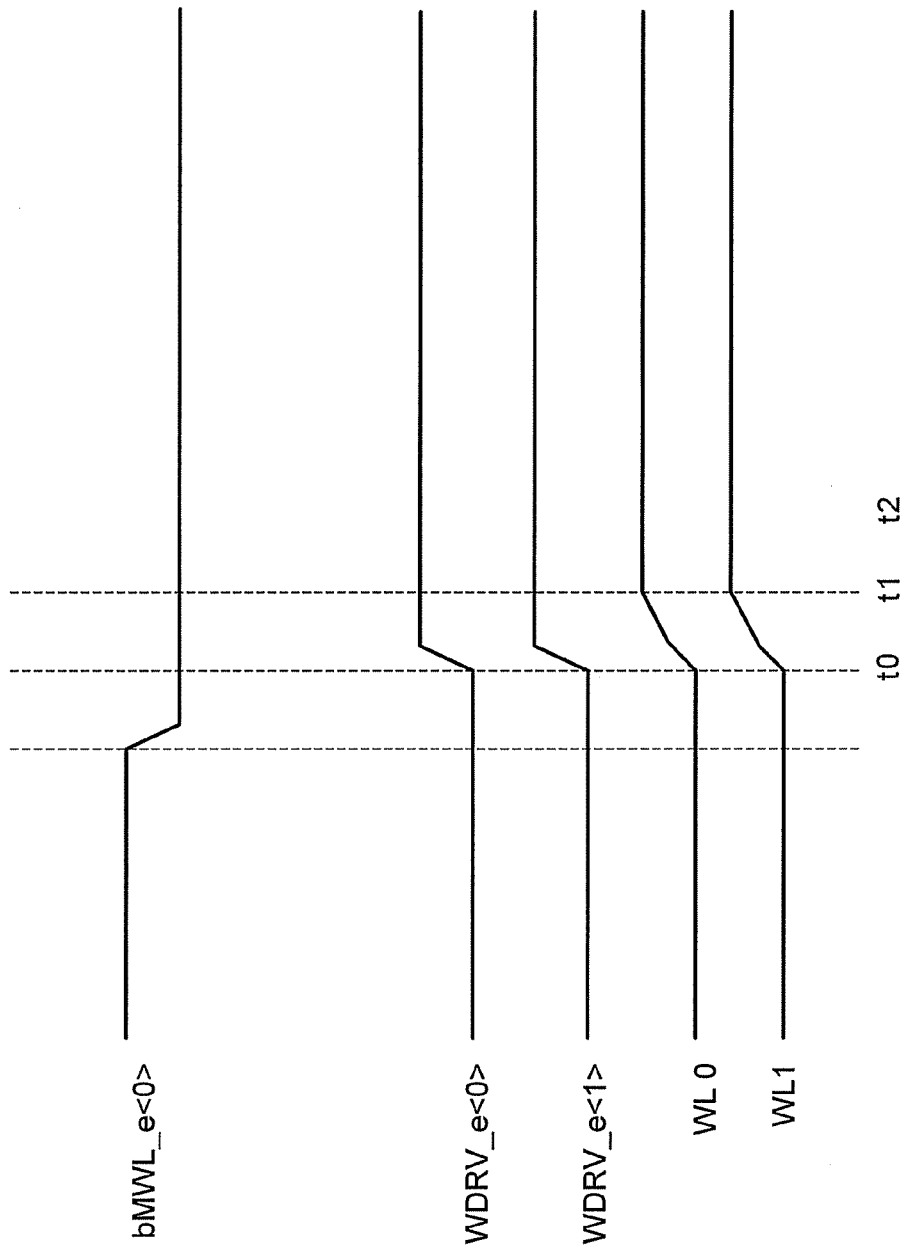
FIG. 17 is a timing diagram showing the selection operation performed by the MRAM according to the third embodiment for selecting the paired word lines WL0 and WL1.

FIG. 17 is a timing diagram showing the selection operation performed by the MRAM according to the third embodiment for selecting the paired word lines WL0 and WL1. At a time t0, only the main word line bMWL_e<0> is activated to logic low. The inverter circuits connected to the main word line bMWL_e<0> shown in FIG. 2 are thereby driven.

At a time t1, the word drive lines WDRV_e<0> and WDRV_e<1> are activated to logic high. At a time t2, the word drive lines WDRV_e<0> and WDRV_e<1> thereby drive the local word lines WL0 and WL1 to logic high.

FIG. 18 is a timing diagram showing the selection operation performed by the MRAM according to the third embodiment for selecting the paired word lines WL3 and WL4. At the time t0, the main word lines bMWL_e<0> and bMWL_o<1> are activated to logic high. The inverter circuits connected to the main word lines bMWL_e<0> and bMWL_o<1> shown in FIG. 2 are thereby driven.

At the time t1, the word drive lines WDRV_e<3> and WDRV_o<0> are activated to logic high. At the time t2, the word drive lines WDRV_e<3> and WDRV_o<0> thereby drive the local word lines WL3 and WL4 to logic high.

Even with the configuration according to the third embodiment, it is possible to select the specific memory cell MC in the memory cell array MCA shown in FIGS. 2 and 3 similarly to the first embodiment. Further, the layout of the memory cell array MCA of the second embodiment is identical to that of the first embodiment (FIG. 3). Therefore, the third embodiment can achieve effects identical to those of the first embodiment.

The embodiments have been described on presumption of adopting the MTJ elements as the memory elements. However, the present invention is also applicable to a memory device such as a PRAM or a ReRAM writing data "0" or "1" according to a voltage direction between two terminals and storing data "0" or "1" according to a change in the resistance of each element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of bit lines;
a plurality of word lines; and
a plurality of memory cells, each memory cell including a memory element configured to store data based on a difference between resistance values of the memory element, and the plurality of memory cells connected between a first and a second bit line, wherein
the plurality of memory cells arranged in a direction of the bit lines constitute columns,
the second bit line is shared by two columns adjacent to each other,
a first set of memory cells in a first pair of columns sharing the second bit line are arranged to be shifted in the direction of the bit lines by a half-pitch of a second set of memory cells in a second pair of columns adjacent to the first pair of columns,
a dummy cell arranged between the two adjacent paired columns, and having an equal distance from the adjacent memory elements; and
a row decoder configured to:
drive the first set of memory cells in the first pair of columns by applying a voltage to two adjacent paired word lines WLk and WLk+1, where k is an integer, and
drive the second set of memory cells in the second pair of columns by applying the voltage to two adjacent and paired word lines WLk+1 and WLk+2;
wherein each of the plurality of memory cells includes a plurality of selection transistors for each of the memory elements, the selection transistors connected in parallel between the memory element corresponding to the selection transistors and the first bit line, and wherein gates of the transistors are connected to different word lines, respectively.

2. The device of claim 1, wherein the row decoder is arranged on each side of a memory cell array, the memory cell array including the plurality of memory cells;

a first row decoder arranged on one side of the memory cell array drives one half of a set of word lines included in the memory cell array; and a second row decoder arranged on the other side of the memory cell array drives the other half of the set of word lines included in the memory cell array.

3. The device of claim 2, wherein a plurality of memory cell arrays share the set of word lines;

each of the memory cell arrays including a first and a second row decoder; and the device further comprises:

a first main word line connected to the first row decoder;

a second main word line connected to the second row decoder; and a main row decoder configured to simultaneously drive a plurality of first row decoders corresponding to the plurality of memory cell arrays sharing the word lines and to simultaneously drive a plurality of second row decoders corresponding to the plurality of memory cell arrays sharing the word lines by selectively driving one of the first main word line and the second main word line.

4. The device of claim 3, further comprising:

a first word drive line connected to one of the set of word lines and configured to drive the first main word line; and a second word drive line connected to one of the set of word lines and configured to drive the second main word line;

wherein one pair of the set of word lines is selected by driving one of the first main word line and the second main word line and by driving one of the first word drive line and the second word drive line.

5. The device of claim 1, wherein the dummy cell is arranged below the second bit line.

6. The device of claim 2, wherein the dummy cell is arranged below the second bit line.

7. The device of claim 3, wherein the dummy cell is arranged below the second bit line.

8. The device of claim 4, wherein the dummy cell is arranged below the second bit line.

9. The device of claim 1, wherein the first and second main word lines extend in the same direction as a direction of the word lines on a wiring layer different from a wiring layer on which the word lines are arranged.

10. The device of claim 1, wherein at least one bit of an N-bit address signal, where N is an integer, is configured to select one pair of word lines and is used as an address for selecting one pair of columns.

11. The device of claim 2, wherein at least one bit of an N-bit address signal, where N is an integer, is configured to select one pair of word lines and is used as an address for selecting one pair of columns.

12. The device of claim 3, wherein at least one bit of an N-bit address signal, where N is an integer, is configured to select one pair of word lines and is used as an address for selecting one pair of columns.

13. The device of claim 5, wherein at least one bit of an N-bit address signal, where N is an integer, is configured to select one pair of word lines and is used as an address for selecting one pair of columns.

14. The device of claim 9, wherein at least one bit of an N-bit address signal, where N is an integer, is configured to select one pair of word lines and is used as an address for selecting one pair of columns.

15. The device of claim 2, wherein the word lines connected to the first row decoder and the word lines connected to the second row decoder are arranged such that they alternate one-at-a-time.

16. The device of claim 2, wherein the word lines connected to the first row decoder and the word lines connected to the second row decoder are arranged such that they alternate two-or-more-at-a-time.

* * * * *